United States Patent
Ogura et al.

(10) Patent No.: US 7,183,498 B2
(45) Date of Patent: Feb. 27, 2007

(54) HIGH-FREQUENCY MODULE AND ELECTRONIC DEVICE USING THE MODULE

(75) Inventors: Tomohide Ogura, Gifu (JP); Junichi Kimura, Aichi (JP); Noriharu Esaki, Gifu (JP); Tatuya Okamoto, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/241,917

(22) Filed: Oct. 4, 2005

(65) Prior Publication Data

US 2006/0072292 A1 Apr. 6, 2006

(30) Foreign Application Priority Data

Oct. 5, 2004 (JP) .............................. 2004-292225

(51) Int. Cl.
*H05K 9/00* (2006.01)
(52) U.S. Cl. ..................... 174/387; 174/377; 174/384; 361/816; 361/752
(58) Field of Classification Search ............... 174/377, 174/384, 387; 361/752, 816
See application file for complete search history.

(56) References Cited

U.S. PATENT DOCUMENTS 4,370,515 A * 1/1983 Donaldson ................. 174/387
5,369,552 A * 11/1994 Barnes et al. ............... 361/816
5,416,668 A * 5/1995 Benzoni ...................... 361/816
5,608,188 A * 3/1997 Choon et al. ............... 174/372
5,844,784 A * 12/1998 Moran et al. ............... 361/818
5,895,884 A * 4/1999 Davidson .................... 174/372
5,917,708 A * 6/1999 Moran et al. ............... 361/800
6,538,903 B1 * 3/2003 Radu et al. ................. 361/818
2004/0165369 A1 * 8/2004 Lionetta et al. ............ 361/818

FOREIGN PATENT DOCUMENTS

JP 11-331015 11/1999

* cited by examiner

*Primary Examiner*—Hung V. Ngo
(74) *Attorney, Agent, or Firm*—Wenderoth, Lind & Ponack, L.L.P.

(57) ABSTRACT

A high-frequency module has an attached shield case. Barrier 36 of the shield case has wall 37 provided by being bent from ceiling section 32; wall 38 that is opposed to wall 37 and that is provided by being bent from ceiling section 32; and linkage section 39 for linking the tip end of wall 38 to the tip end of wall 37. The shield case further has: a crossing section at which wall 37 crosses ceiling section 32 and side plate 33; notches 43 respectively provided at the crossing sections at which wall 38, ceiling section 32 and side plate 33 cross one another; and division section 44 extending downward from notches 43 for segmentalizing side plate 33. A boundary between circuit block 4 and circuit block 5 is provided at a position corresponding to barrier 36. Connection section 34 is connected to the ground of circuit block 4 or circuit block 5. As a result, a module having a superior shielding performance can be provided to prevent leakage of a signal from a circuit provided on the printed circuit board.

19 Claims, 12 Drawing Sheets

US 7,183,498 B2

HIGH-FREQUENCY MODULE AND ELECTRONIC DEVICE USING THE MODULE

TECHNICAL FIELD

The present invention relates to a high-frequency module to which a shield case is attached for the use in a high-frequency apparatus.

BACKGROUND OF THE INVENTION

A conventional high-frequency module disclosed in Japanese Patent Unexamined Publication No. H11-331015, for example, will be described with reference to the drawings. FIG. 19 is a cross-sectional view of a high-frequency module using a conventional shield case. FIG. 20 is a bottom view of the shield case.

In the conventional high-frequency module, electronic components 2 and 3 are mounted on upper face 1a of printed circuit board 1. The high-frequency module is provided by oscillator 4 including electronic component 2 on printed circuit board 1 and PLL circuit 5 including electronic component 3. It is noted that oscillator 4 is an example of a first circuit block and PLL circuit 5 is an example of a second circuit block.

Shield case 6 is attached to printed circuit board 1 so that top face 6a covers electronic components 2 and 3. Then, connection section 7 is provided at the tip end of side plate 6b provided by bending top face 6a. Connection section 7 is a projection having a width of 6 mm and a length of 0.7 mm. Shield case 6 and printed circuit board 1 are connected by soldering connection section 7 with terminal section 8 provided at side face section 1b of printed circuit board 1.

Then, the center part of shield case 6 is integrated with barrier 6c provided by partially cutting and bending shield case 6 from top face 6a. At the tip end of barrier 6c, leg 9 is provided. On the other hand, a position on printed circuit board 1 corresponding to leg 9 is provided with through hole 10. Leg 9 is inserted into through hole 10. When leg 9 is soldered in through hole 10, printed circuit board 1 is connected with shield case 6.

In shield case 6 as described above, barrier 6c is formed by partially cutting and bending shield case 6 from top face 6a. Thus, hole 11 having a size corresponding to the size of barrier 6c is formed in shield case 6. Due to hole 11 formed in top face 6a, the conventional high-frequency module using shield case 6 as described above had a problem of poor shielding performance.

SUMMARY OF THE INVENTION

In view of the above, the present invention solves this problem. It is an objective of the present invention to provide a high-frequency module having superior shielding performance.

In order to achieve this objective, the high-frequency module of the present invention has a shield case. The shield case has a first barrier. The first barrier has: a first wall provided by being bent from the ceiling section of the shield case; a second wall that is opposed to the first wall and that is bent by being bent from the ceiling section; a linkage section for linking the tip end of the second wall to the tip end of the first wall; and an opening section opened at the upper part of the linkage section. The linkage section is provided to be bent. The shield case includes notches respectively provided at a first crossing section at which the first wall, the ceiling section and the side plate cross one another and at a second crossing section at which the second wall, the ceiling section and the side plate cross one another. A division section for dividing the side plate is further provided and extends from these notches in the downward direction. The boundary between a first circuit block and a second circuit block is provided at a position corresponding to the first barrier. The connection section is connected to the ground of the first circuit block or the second circuit block.

DESCRIPTION OF THE INVENTION

In the high-frequency module of the present invention, a barrier has a first wall and a second wall which are bent from a top face. A side plate adjacent to the barrier includes a notch and a division section, and the barrier can be provided without providing a hole in the top face. Thus, a high-frequency module can be provided through which a signal from a circuit provided on the printed circuit board for example can be prevented from leakage.

Furthermore, the barrier is provided such that the first wall is opposed to the second wall. Thus, double barriers are provided between a first circuit block and a second circuit block. This can provide a secure shielding between the circuit blocks, thus suppressing electromagnetic interference between the respective circuits.

Hereinafter, specific embodiments of the present invention will be described.

Figure 1:
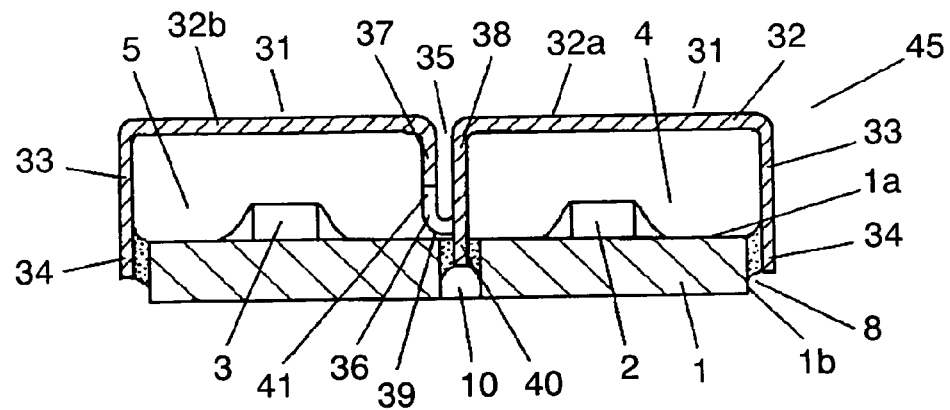
FIG. 1 is a cross-sectional view of a high-frequency module using a shield case in embodiment 1 of the present invention.
Figure 2:
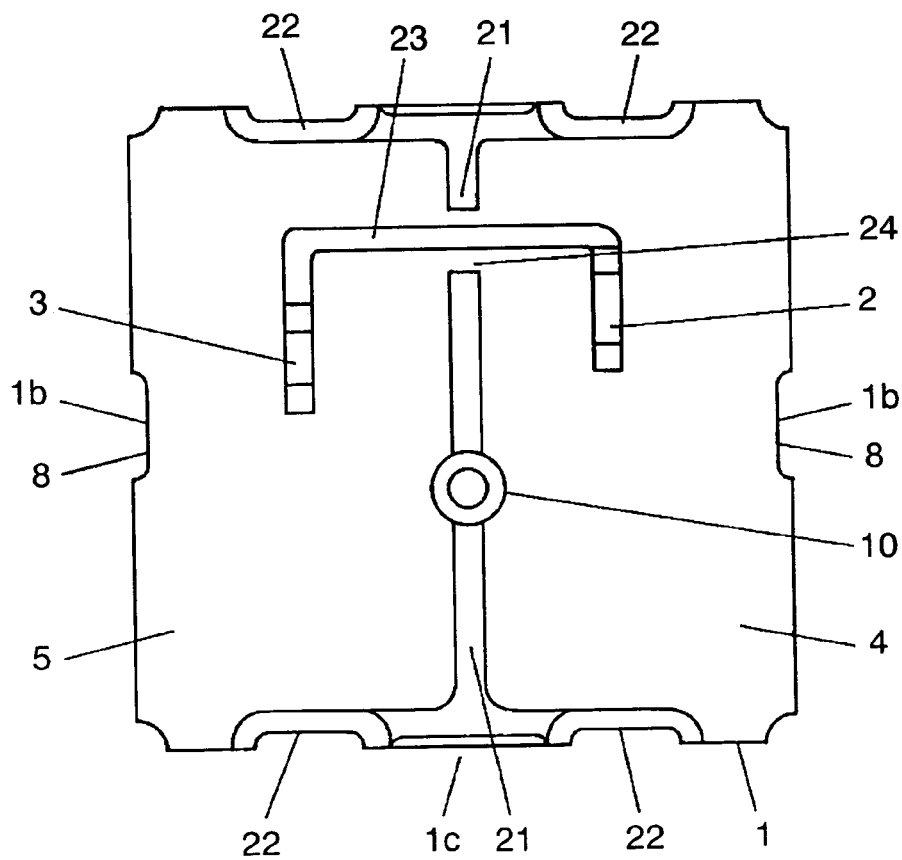
FIG. 2 is a plan view of a printed circuit board in embodiment 1 of the present invention.
Figure 3:
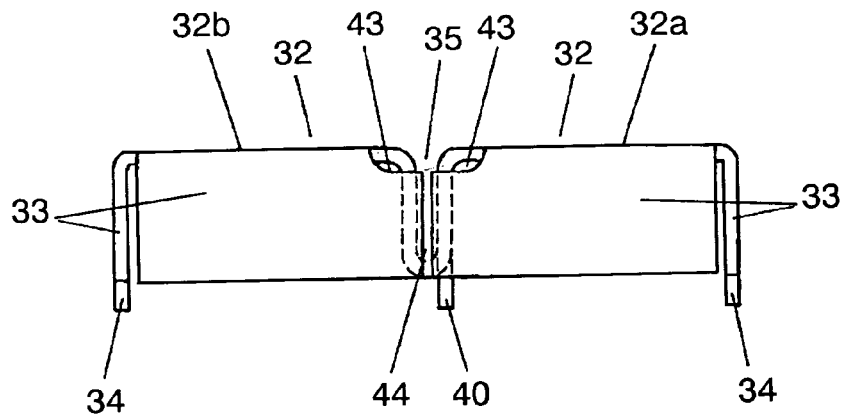
FIG. 3 is a side view of a shield case in embodiment 1 of the present invention.
Figure 4:
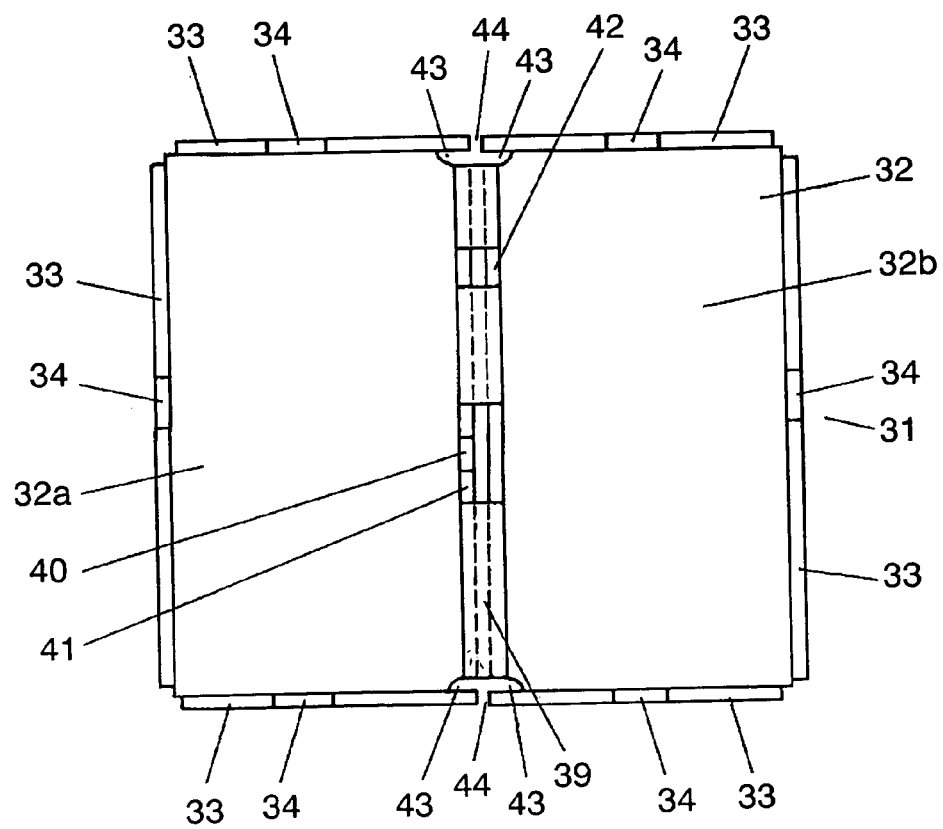
FIG. 4 is a bottom view of the shield case in embodiment 1 of the present invention.
Figure 19:
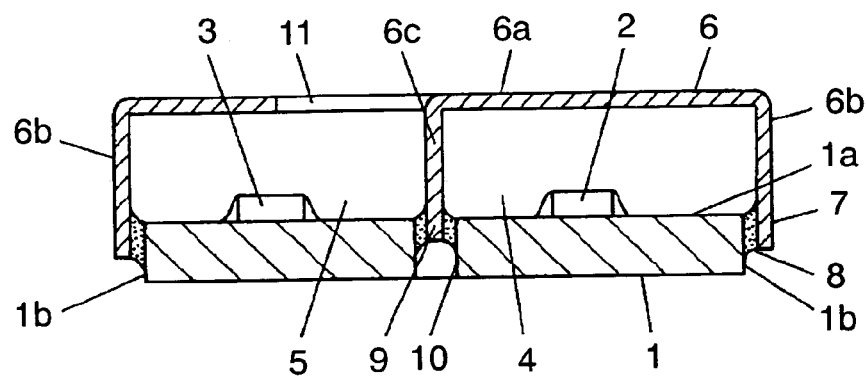
FIG. 19 is a cross-sectional view of a high-frequency module using a conventional shield case.
Figure 20:
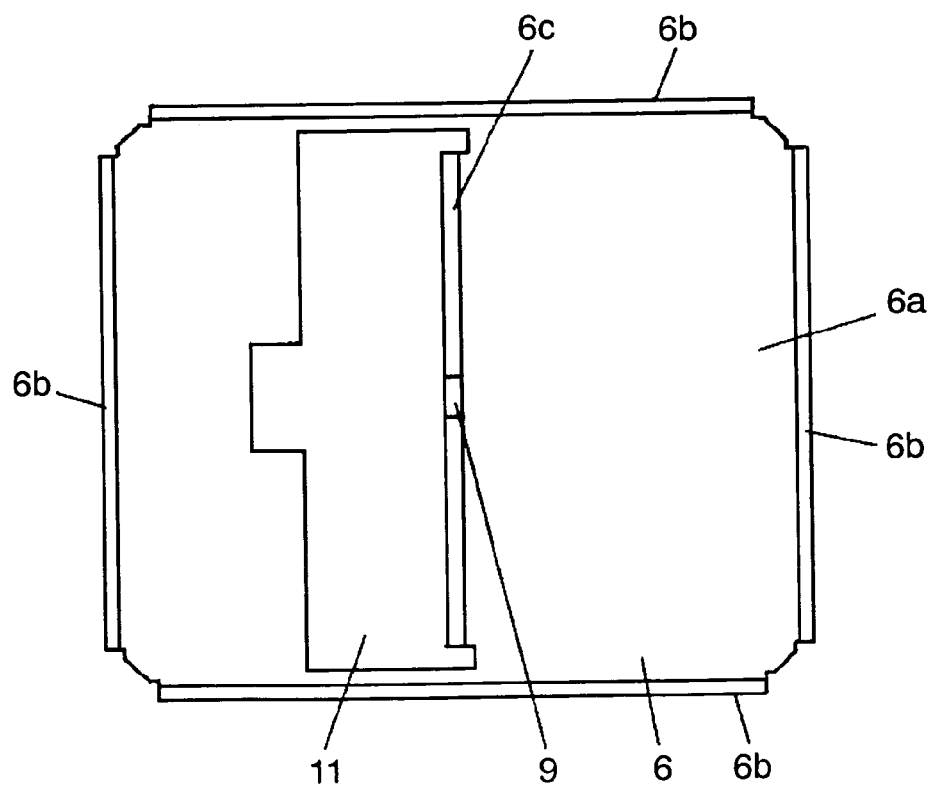
FIG. 20 is a bottom view of the conventional shield case.

Hereinafter, embodiment 1 of the present invention will be described with reference to the drawings. FIG. 1 is a cross-sectional view of a high-frequency module in embodiment 1 of the present invention. FIG. 2 is a plan view illustrating a printed circuit board in embodiment 1. FIG. 3 is a side view illustrating a shield case in embodiment 1 and FIG. 4 is the bottom view thereof. In FIG. 1, the same components as those of FIG. 19 and FIG. 20 are denoted with the same reference numerals and will not be described further.

As shown in FIG. 2, printed circuit board 1 used in embodiment 1 has ground pattern 21 provided substantially at the center. Ground pattern 21 is connected to ground terminal 22 provided in the vicinity of end section 1c of printed circuit board 1. At substantially the center part of printed circuit board 1, through hole 10 is provided and is connected with ground pattern 21. The term "through hole 10" hereinafter means a conductive through hole in which a conductor layer is formed at an inner face of a penetration hole.

Both sides, of printed circuit board 1, sandwiching ground pattern 21 are attached with electronic components 2 and 3, respectively. In FIG. 2, oscillator 4 is provided at the right side of ground pattern 21 while PLL circuit 5 is provided at the left side of ground pattern 21. This can securely separate oscillator 4 from PLL circuit 5 by ground pattern 21. Oscillator 4 is connected with PLL circuit 5 by connection pattern 23. Connection pattern 23 crosses no-ground section 24 of ground pattern 21. Herein, oscillator 4 is an example of a first circuit block and PLL circuit 5 is an example of a second circuit block.

Next, shield case 31 in embodiment 1 will be described with reference to FIG. 1, FIG. 3 and FIG. 4. Shield case 31 is made of metal. Ceiling section 32 of shield case 31 is attached to printed circuit board 1 so as to cover upper face 1a of printed circuit board 1. It is noted that shield case 31 in embodiment 1 uses a copper-nickel-zinc alloys plate having a thickness of 0.2 mm.

Shield case 31 has connection section 34 that is provided at the tip end of side plate 33 by bending ceiling section 32 in four directions. Connection section 34 is attached and connected, by soldering, to terminal section 8 provided at side face 1b of printed circuit board 1.

In shield case 31, ceiling section 32 has opening section 35 having a width of about 0.05 mm. At one side of opening section 35, shield case 31 has top face 32a covering the top of oscillator 4. At the other side of opening section 35, shield case 31 has top face 32b covering the top of PLL circuit 5.

Barrier 36 can provide a link between top face 32a and top face 32b and can electrically separate the block of oscillator 4 from the block of PLL circuit 5. Barrier 36 is composed of wall 37, wall 38, and linkage section 39 for linking the tip ends of them to each other. Linkage section 39 has a bent shape with an angle of substantially 180 degrees. Specifically, as shown in FIGS. 1 and 3, barrier 36 has a cross-sectional shape having a substantially U-like shape. Opening section 35 is a part in which a space formed by wall 37 and wall 38 is opened in the upward direction. Wall 37 or wall 38 may correspond to any of the first wall or the second wall, respectively.

Leg 40 provided at the tip end of wall 38 is formed by partially cutting and bending linkage section 39 and wall 37. When leg 40 is attached to printed circuit board 1, leg 40 is inserted into through hole 10 and connected to printed circuit board 1 by soldering. Leg 40 also can be used for the positioning of shield case 31 when shield case 31 is attached to printed circuit board 1. Thus, shield case 31 can be attached to printed circuit board 1 with high accuracy.

Hole 41 is provided at linkage section 39 and wall 37, thus providing leg 40 at the tip end of wall 38 in an easy manner. Leg 40 has a width of 0.5 mm and a length of 0.5 mm. Thus, by providing a space of about 0.5 mm between the inner circumference of hole 41 and leg 40, leg 40 can be press-worked easily.

At the upper part of leg 40, opening section 35 is provided. Thus, soldering between leg 40 and through hole 10 can be easily checked through opening section 35. As a result, defective soldering can be prevented.

Conduction avoiding section 42 provided at linkage section 39 is formed, when shield case 31 is attached to printed circuit board 1, at a position corresponding to connection pattern 23. Conduction avoiding section 42 is preferably provided by an uneven step. However, conduction avoiding section 42 can also be provided by partially cutting the case. Conduction avoiding section 42 has a width that is larger than the width of connection pattern 23 by about 1 mm in order to prevent the short circuit of connection pattern 23. Conduction avoiding section 42 has a height of 0.3 mm.

Conduction avoiding section 42 can be provided at an arbitrary position. Therefore, oscillator 4 can be connected with PLL circuit 5 at an arbitrary position using connection pattern 23. As described above, embodiment 1 can provide conduction avoiding section 42 to easily realize an electric connection between the circuit blocks without using a through hole or the like.

Notches 43 are provided at a crossing section at which wall 38, top face 32a, and side plate 33 cross one another and a crossing section at which wall 37, top face 32b, and side plate 33 cross one another, respectively. Furthermore, side plates 33 have division section 44 that extends from notches 43 in the downward direction so as to divide side plates 33. Division section 44 cuts off side plates 33, thereby separating neighboring side plates 33 from each other.

In embodiment 1, division section 44 is provided so that opening section 35 can be viewed through division section 44.

Then, shield case 31 as described above is attached on printed circuit board 1 to which electronic components 2 and 3 or the like were previously mounted. Thereafter, a space between connection section 34 and terminal section 8 and a space between leg 40 and through hole 10 are supplied with cream solder and are subjected to a reflow heating, thereby soldering shield case 31 onto printed circuit board 1.

By the procedure as described above, high-frequency module 45 can be obtained in which oscillator 4 and PLL circuit 5 are separated by shield case 31.

Figure 5:
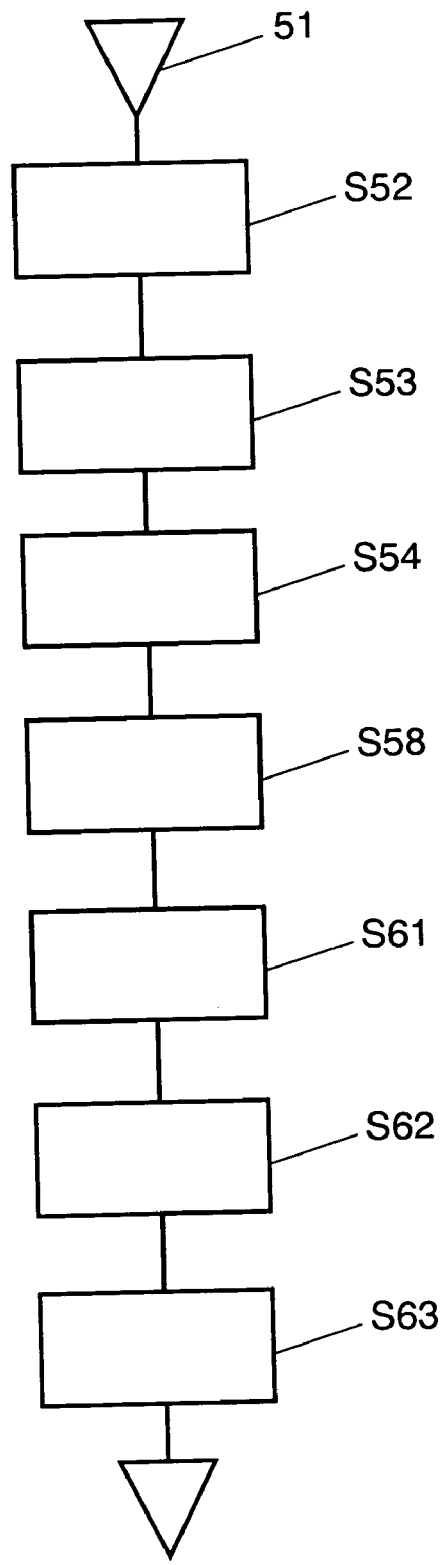
FIG. 5 is a manufacturing flowchart of the shield case in embodiment 1 of the present invention.
Figure 6:
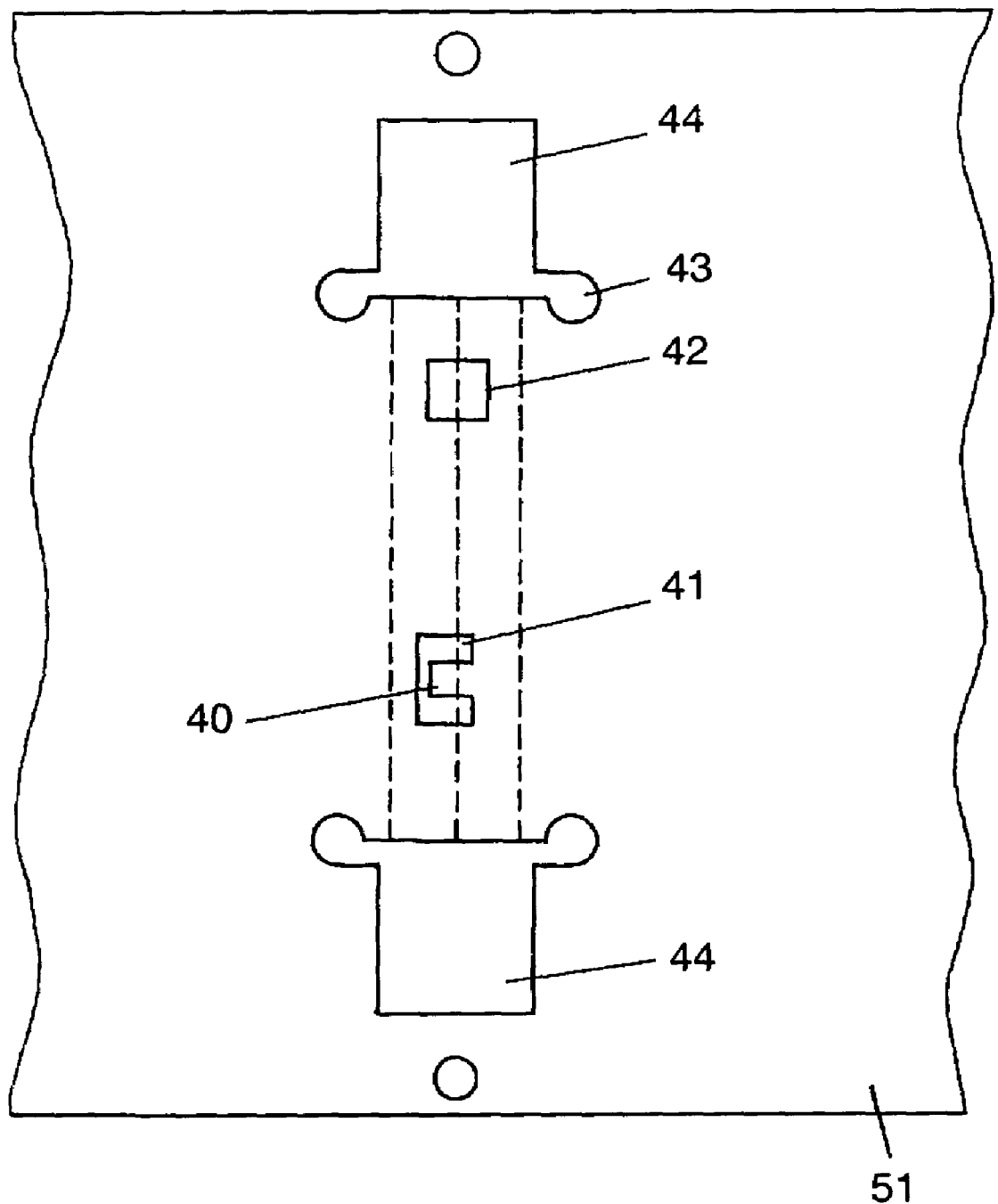
FIG. 6 is a plan view showing a punching step in embodiment 1 of the present invention.
Figure 7:
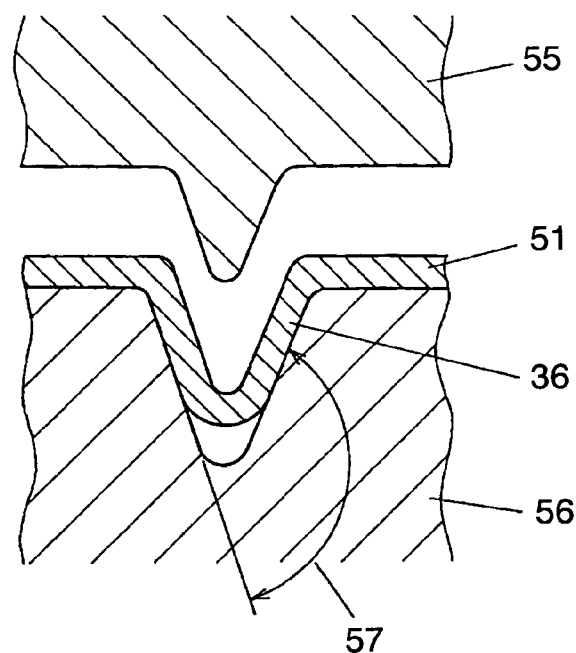
FIG. 7 is a cross-sectional view showing a V-drawing step in embodiment 1 of the present invention.
Figure 8:
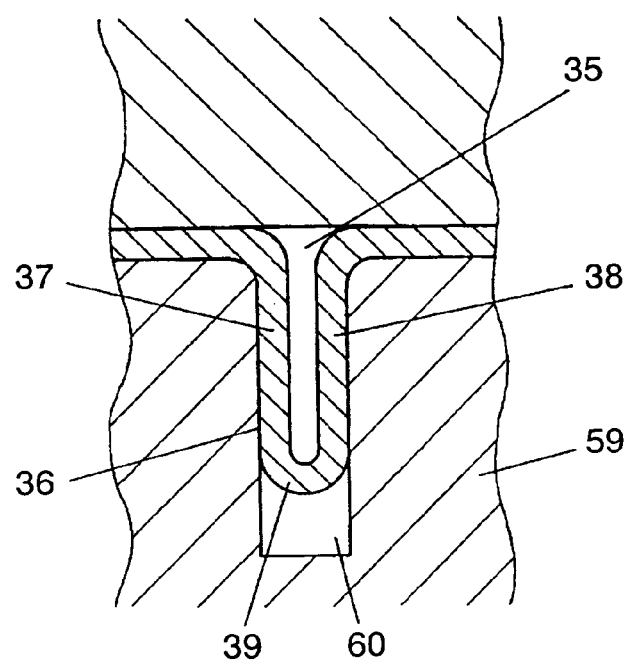
FIG. 8 is a cross-sectional view showing a forming step in embodiment 1 of the present invention.

Next, a method for manufacturing shield case 31 in embodiment 1 will be described with reference to the drawings. FIG. 5 is a manufacturing flowchart of shield case 31 in embodiment 1. FIG. 6 to FIG. 8 illustrate the manufacturing steps in detail.

Hoop material 51 wound to have a roll-like shape for manufacturing shield case 31 is prepared. Hoop material 51 is the material of shield case 31.

First, in reference-hole processing step S52, reference holes are formed in hoop material 51.

Next, in punching step S53, leg 40, hole 41, conduction avoiding section 42, notch 43, and division section 44 are punched out as shown in FIG. 6.

In V-shaped drawing step S54, V-shaped male mold 55 and V-shaped female mold 56 sandwich hoop material 51 as shown in FIG. 7, thereby forming V-shaped barrier 36 on hoop material 51. It is noted that linkage section 39 in this step is bent to have angle 57 of only about 120 degrees.

Next, in barrier forming step S58 linkage section 39 is bent until its angle is substantially 180 degrees as shown in FIG. 8. In forming step S58, V-shaped barrier 36 bent by V-shaped drawing step S54 is pushed into hole 60 provided in female mold 59, thereby bending linkage section 39 to have an angle of substantially 180 degrees.

Hole 60 has a width of 0.45 mm so that opening section 35 after the formation has a width of 0.05 mm that is smaller than the thickness of shield case 31. As a result, V-shaped drawing step S54 and forming step S58 can provide opening section 35 with a width smaller than the thickness of shield case 31. Thus, barrier 36 has a double structure. However, barrier 36 can have a thickness of about 0.45 mm and thus the bent part is prevented from having an increased thickness. Therefore, a region on printed circuit board 1 on which oscillator 4 and PLL circuit 5 can be provided can be prevented from having a reduced size. The distance between oscillator 4 and PLL circuit 5 can also be reduced, thus realizing a high-frequency module having a small size.

Barrier 36 is provided by V-shaped drawing step S54 and forming step S58 so that shield case 31 has barrier 36 with a height set with high accuracy. Thus, when shield case 31 is attached to printed circuit board 1, a space between the tip end of linkage section 39 and ground pattern 21 can be reduced, thereby improving the shielding performance. The secure soldering between linkage section 39 and ground pattern 21 can further improve the shielding.

Forming step S58 is followed by outer shape processing step S61. Outer shape processing step S61 is a step for punching out the material in order to form side plate 33 and connection section 34, for example.

Outer shape processing step S61 is followed by bending step S62 in which first two side plates 33 are bent. Then, cutting step S63 bends and cuts the remaining two side plates 33, thereby completing shield case 31.

Although embodiment 1 uses a processing method involving a progressive press processing, another method like transfer may also be used. Although embodiment 1 involves V-shaped drawing step S54 and forming step S58 being performed before bending step S62, V-shaped drawing step S54 and forming step S58 may be provided between bending step S62 and cutting step S63.

By the use of the manufacturing method as described above, linkage section 39 in barrier 36 is formed by being bent with an angle of substantially 180 degrees, thereby causing wall 37 to be opposed to wall 38. Then, side plate 33 adjacent to barrier 36 includes notch 43 and division section 44. Thus, barrier 36 can be formed without providing a hole in ceiling section 32. As a result, shield case 31 having a superior shielding performance can be provided such that a signal from a circuit provided on printed circuit board 1 for example is prevented from being leaked to outside.

Furthermore, barrier 36 is formed by being bent in linkage section 39. Thus, oscillator 4 and PLL circuit 5 have therebetween a double structure formed by walls 37 and 38. Thus, these circuit blocks can be securely shielded against each other, suppressing interference among the respective signals.

Figure 9:
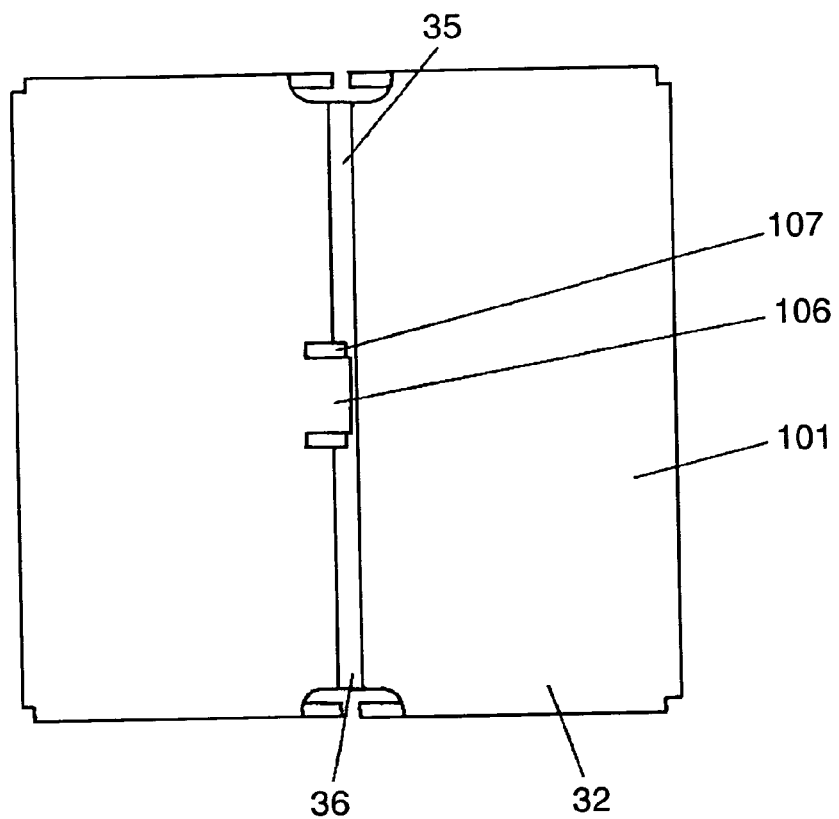
FIG. 9 is a plan view illustrating a shield case in embodiment 2.
Figure 10:
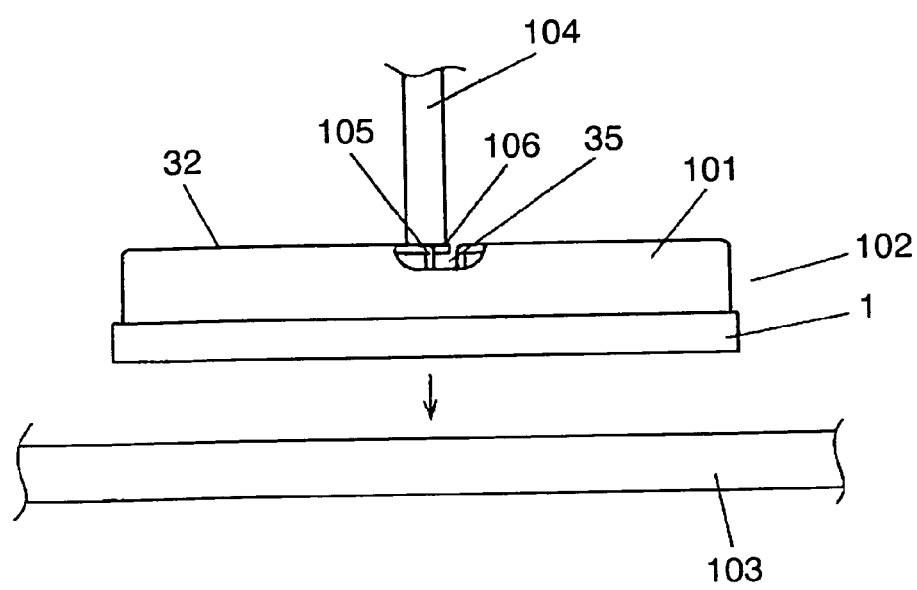
FIG. 10 is a perspective view showing a step for attaching a high-frequency module in embodiment 2.

Hereinafter, embodiment 2 will be described with reference to the drawings. FIG. 9 is a plan view of shield case 101 in embodiment 2. FIG. 10 is a schematic view in which a high-frequency module using shield case 101 in embodiment 2 is attached to a motherboard 103. In FIG. 9 and FIG. 10, the same components as those of FIGS. 1 to 4 are denoted with the same reference numerals and will not be described further.

In embodiment 2, oscillator 4 and PLL circuit 5 are divided at the center and barrier 36 is provided along the center of shield case 101. Specifically, in this case, opening section 35 is at a position along the center of ceiling section 32.

FIG. 10 illustrates high-frequency module 102 completed by attaching shield case 101 to printed circuit board 1 on which electronic components 2 and 3 (not shown) were previously mounted. High-frequency module 102 is mounted on motherboard 103 by an automatic mounter for example. In this case, pickup nozzle 104 of the automatic mounter picks up the substantially center part of high-frequency module 102.

When the center part is opening section 35, however, pickup nozzle 104 cannot pick up high-frequency module. To solve this, shield case 101 in embodiment 2 has flat plate-like pickup face 106 at substantially the center of opening section 35 and extending from top face 32. In embodiment 2, pickup face 106 is provided by cutting from one wall 105. This allows pickup nozzle 104 to use pickup face 106 at the center of shield case 101 to pick up high-frequency module 102. As a result, high-frequency module 102 is prevented from being inclined for example when being mounted, thus providing a stable mounting. Therefore, high-frequency module 102 is prevented from being mounted in a dislocated manner. Thus, high-frequency module 102 can be connected with motherboard 103 by soldering in a favorable manner.

When pickup face 106 is formed, hole 107 may be formed in one wall 105. However, the double structure of barrier 36 suppresses interference of signals between oscillator 4 and PLL circuit 5.

In embodiment 2, opening section 35 extends along substantially the center of high-frequency module 102. When the gravity center point of high-frequency module 102 is not at substantially the center on the other hand, pickup face 106 may be provided in the vicinity of the gravity center point. Even when opening section 35 passes the gravity center point, pickup face 106 can securely pick up high-frequency module 102. Thus, high-frequency module 102 can be prevented from being attached in a dislocated manner for example.

Alternatively, opening section 35 may be provided at a position other than substantially the center or substantially at the gravity center of the high-frequency module. In this case, pickup face 106 can be eliminated and a pickup nozzle of an automatic mounter can pick up high frequency module by top face 32. This may eliminate hole 107 when pickup face 106 is formed, thus further improving the shielding performance. In this case, according to embodiment 2, it is preferable that opening section 35 does not face pickup nozzle 104. However, opening section 35 has a width of 0.05 mm and thus barrier 36 can be moved from the center or gravity center by a small distance. As a result, the barrier 36 can be positioned with increased freedom.

Figure 11:
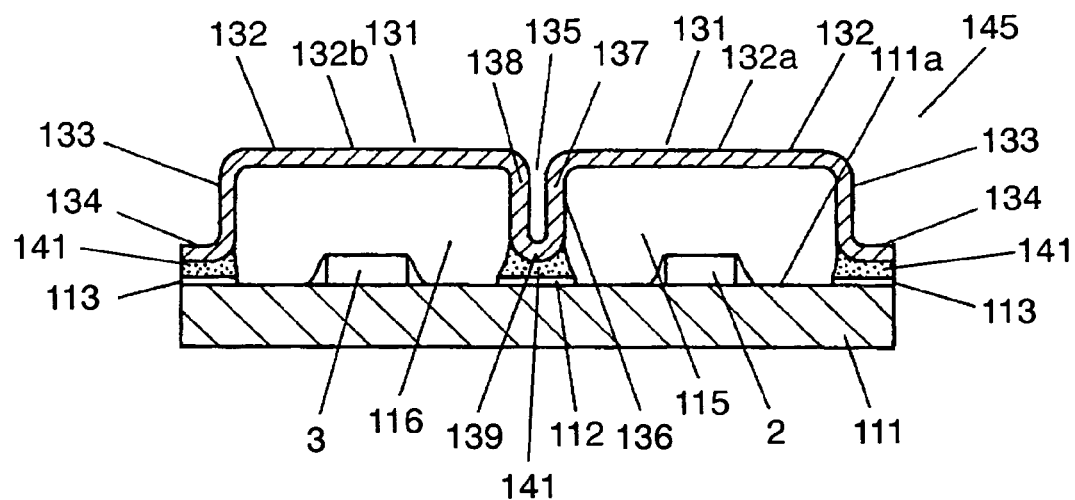
FIG. 11 is a cross-sectional view showing a high-frequency module using the shield case in embodiment 3 of the present invention.
Figure 12:
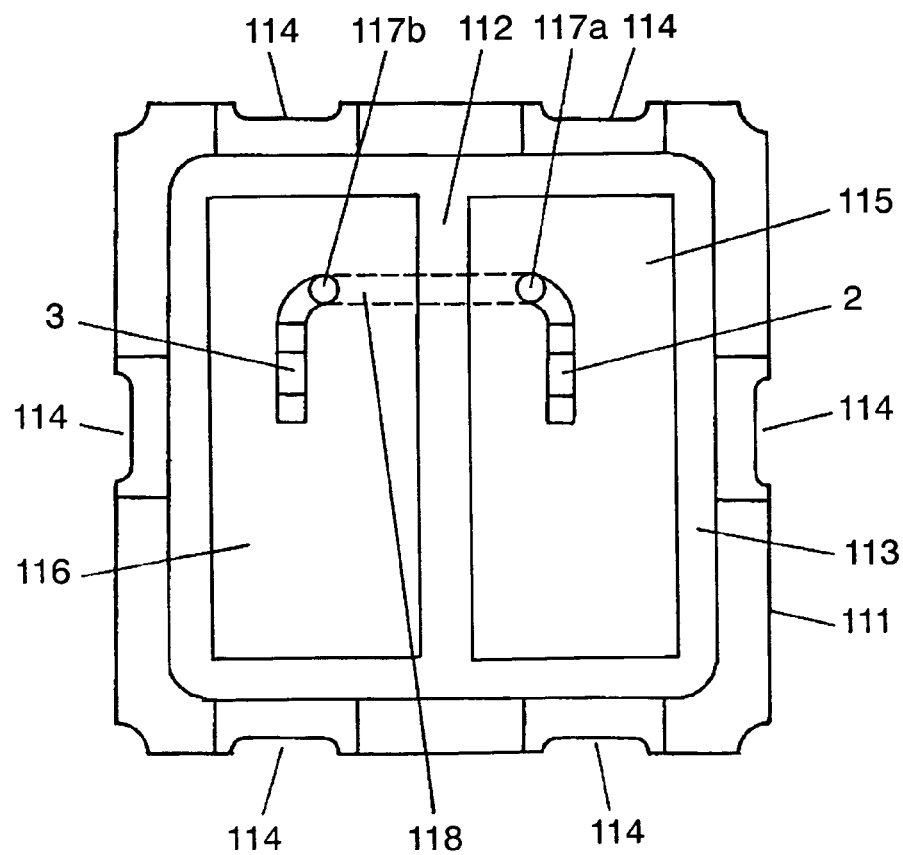
FIG. 12 is a plan view showing a printed circuit board in embodiment 3.
Figure 13:
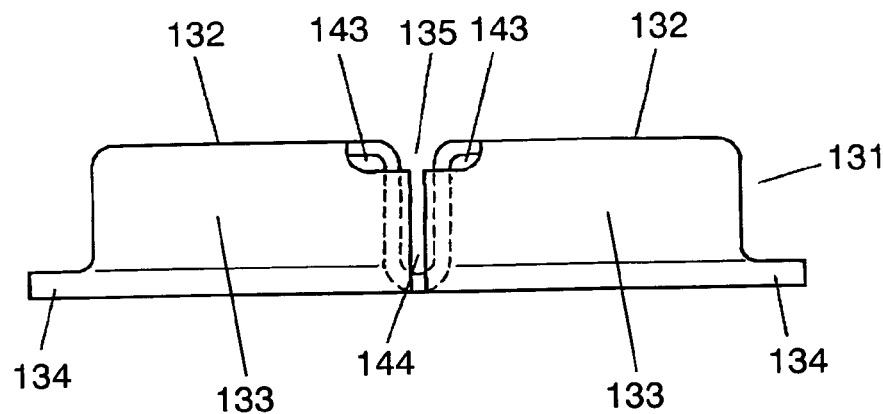
FIG. 13 is a side view showing the shield case in embodiment 3.
Figure 14:
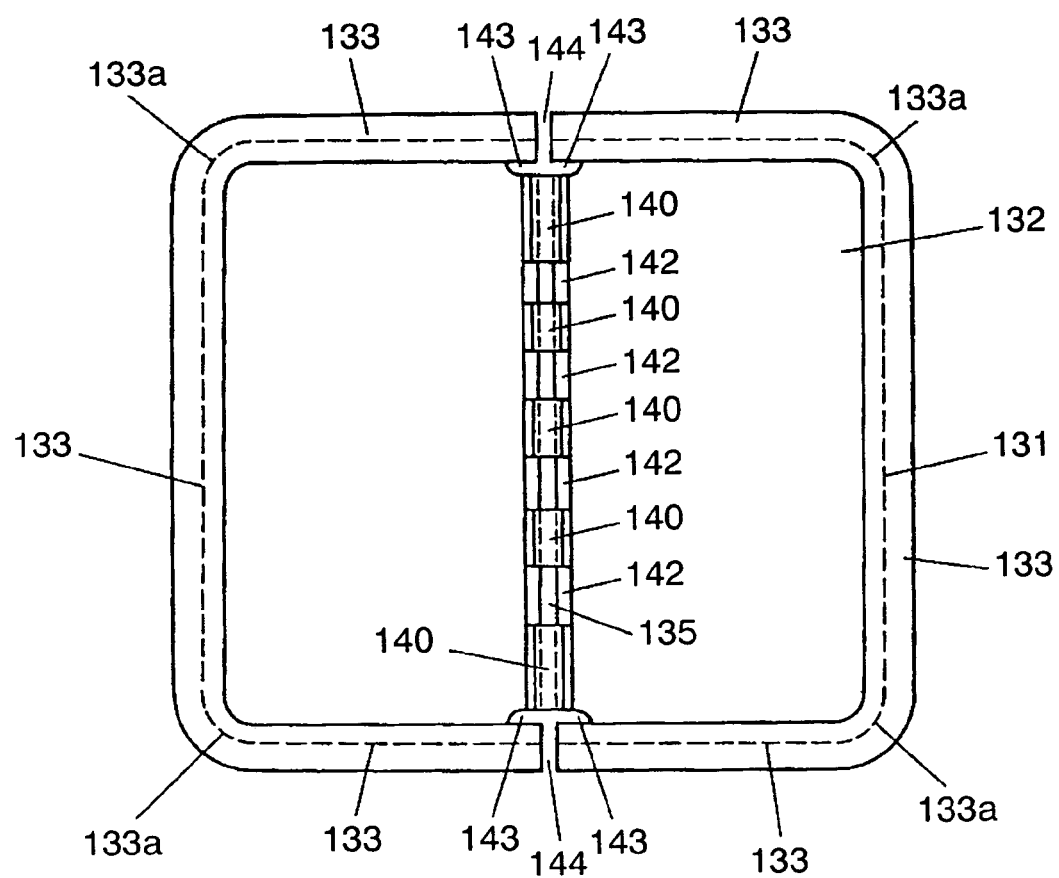
FIG. 14 is a bottom view showing the shield case in embodiment 3.

Hereinafter, embodiment 3 will be described with reference to the drawings. FIG. 11 is a cross-sectional view of high-frequency module 145 in embodiment 3. FIG. 12 is a plan view illustrating a printed circuit board 111 in embodiment 3. FIGS. 13 and 14 are a side view and a bottom view illustrating a shield case of embodiment 3, respectively. In these drawings, the same components as those of FIGS. 1 to 10 are denoted with the same reference numerals and will not be described further.

First, with reference to FIG. 12, a printed circuit board 111 used in embodiment 3 will be described. FIG. 12 shows printed circuit board 111 having four layers. Printed circuit board 111 has ground pattern 112 at the substantially center. Ground pattern 112 is connected with ground pattern 113 provided along the outer periphery of printed circuit board 111 and is further connected with ground terminal 114 provided at the end section of printed circuit board 111.

Next, a region surrounded by ground pattern 113 is attached with electronic components 2 and 3. Oscillator 115 is provided at the right side of ground pattern 112 and PLL circuit 116 is provided at the left side of ground pattern 112 in FIG. 12. As a result, ground pattern 112 separates oscillator 115 from PLL circuit 116. It is noted that oscillator 115 is an example of the first circuit block and PLL circuit 116 is an example of the second circuit block.

Oscillator 115 is connected with PLL circuit 116 by connecting through holes 117a and 117b provided in the respective circuit blocks via inner layer conductor 118.

Next, the shield case in embodiment 3 will be described with reference to FIG. 11, FIG. 13, and FIG. 14. Printed circuit board 111 is attached with metal shield case 131. Ceiling section 132 of shield case 131 is attached so as to cover upper face 111a of printed circuit board 111. Shield case 131 in embodiment 3 has a thickness of 0.2 mm and is made of copper-nickel-zinc alloy.

Shield case 131 has side plates 133 obtained by subjecting ceiling section 132 to a drawing processing in four directions. As a result, neighboring side plates 133 are linked to each other by drawing section 133a. Therefore, shield case 131 having no slit between side plates can be realized. This suppresses an oscillation frequency signal of oscillator 115 or a high-frequency signal of PLL circuit 116 from being leaked to outside.

Shield case 131 further has connection section 134 that is provided at the entire periphery of the tip end of side plate 133 so as to be parallel with upper face 11a of printed circuit board 111. Connection section 134 is connected to ground pattern 113 by solder 141. Thus, connection section 134 can be soldered to ground pattern 113 at the upper face of printed circuit board 111, thus simplifying the soldering. The connection section 134 provided at the entire periphery allows a high-frequency circuit such as oscillator 115 and PLL circuit 116 to be securely surrounded by ground. This suppresses an oscillation frequency signal of oscillator 115 or a high-frequency signal of PLL circuit 116 from being leaked to outside.

Shield case 131 also has opening section 135 that is provided in ceiling section 132. Opening section 135 has a width of about 0.05 mm. Opening section 135 is located between top face 132a and top face 132b. Top face 132a covers the upper part of oscillator 115 and top face 132b covers the upper part of PLL circuit 116.

Shield case 131 has barrier 136 that provides a link between top face 132a and top face 132b and that electrically separates the block of oscillator 115 from the block of PLL circuit 116. Barrier 136 is composed of wall 137, wall 138 and linkage section 139 for linking the tip ends of these walls. Linkage section 139 is bent with an angle of substantially 180 degrees to have a substantially U-like shape. Wall 137 or wall 138 applies to any of the first wall or the second wall, respectively.

Figure 15:
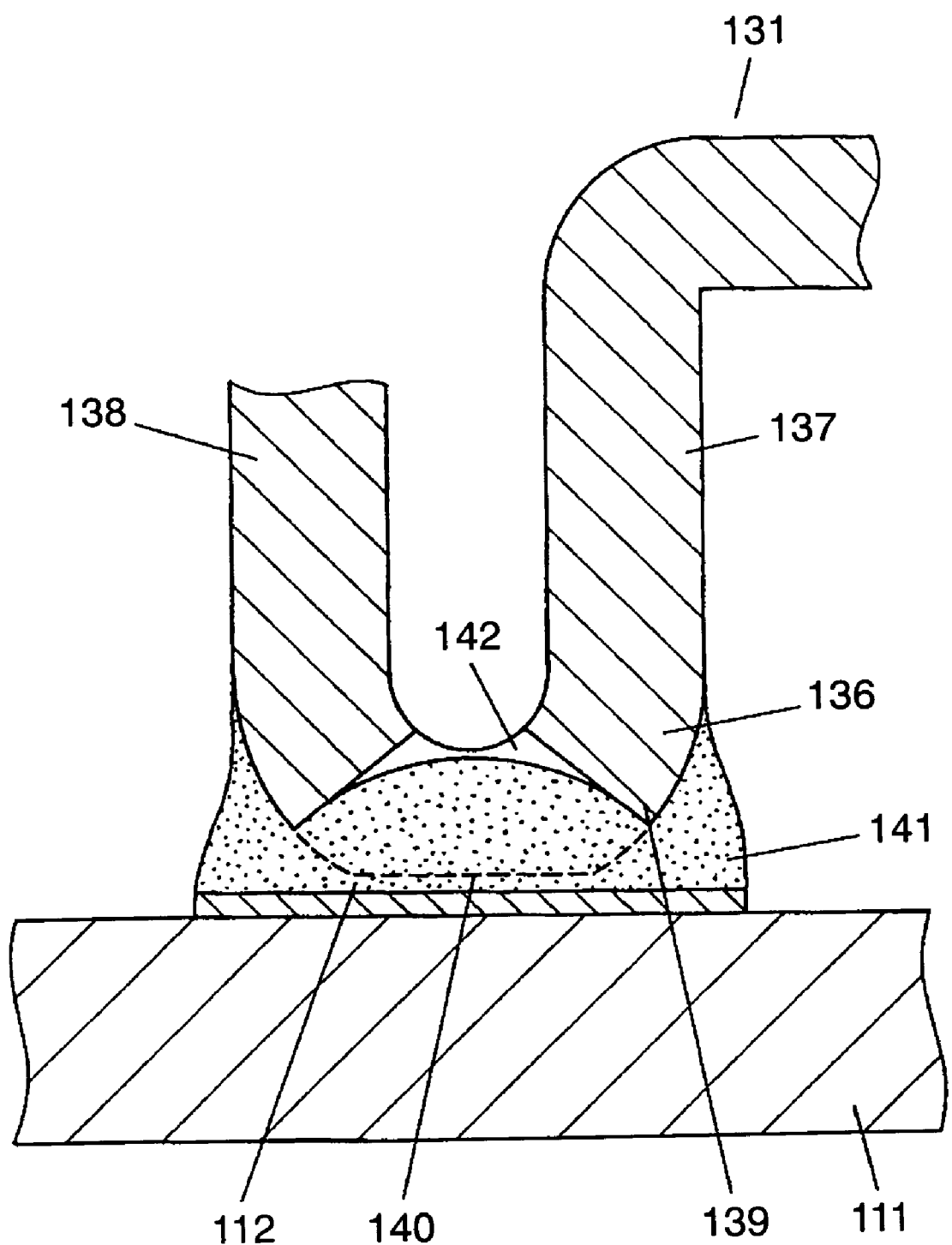
FIG. 15 is an expanded cross-sectional view showing a linkage section in embodiment 3.

FIG. 15 is an expanded view of the neighborhood of a linkage section 139 when shield case 131 is attached to printed circuit board 111 in embodiment 3. In FIG. 15, flat section 140 is provided at the tip end of linkage section 139 so that flat section 140 is parallel with ground pattern 112 when shield case 131 is attached to printed circuit board 111. Flat section 140 is connected with ground pattern 112 by solder 141.

Then, barrier 136 is provided with holes 142 with a substantially equal interval. The solder connection of linkage section 139 to ground pattern 112 can be checked by viewing through holes 142. When it is found by viewing through holes 142 that the connection by solder 141 is incomplete, hot air can be blown from opening section 135 via hole 142 to solder 141 to correct the defective part of solder 141 easily.

As shown in FIG. 11, FIG. 13, and FIG. 14, shield case 131 is provided with notches 143 that are formed at a crossing section at which wall 137, top face 132a and side plate 133 cross one another and a cross section at which wall 138, top face 132b and side plate 133 cross one another, respectively. Furthermore, division section 144 is provided at side plate 133 so as to start from notches 143 in the downward direction to divide side plates 133. In embodiment 3, division section 144 is provided so that opening section 135 can be viewed through division section 144.

Shield case 131 as described above is attached to printed circuit board 111 to which electronic components 2 and 3 or the like were previously attached and on which ground patterns 112 and 113 are supplied with solder. Then, connection section 134 and ground pattern 113, and linkage section 139 and ground pattern 112 respectively are subjected to a reflow heating and are connected by solder. In embodiment 3, solder 141 was previously screen-printed at a predetermined position in a step for attaching electronic components 2 and 3 to printed circuit board 111. Specifically, shield case 131 is attached to printed circuit board 111 after a step of reflow-soldering electronic components 2 and 3 on printed circuit board 111. Thus, it is required, prior to the attachment of shield case 131 to printed circuit board 111, to supply only flux onto ground patterns 112 and 113.

In the manner as described above, high-frequency module 145 can be constructed to have oscillator 115 separated from PLL circuit 116 by barrier 136.

Figure 16:
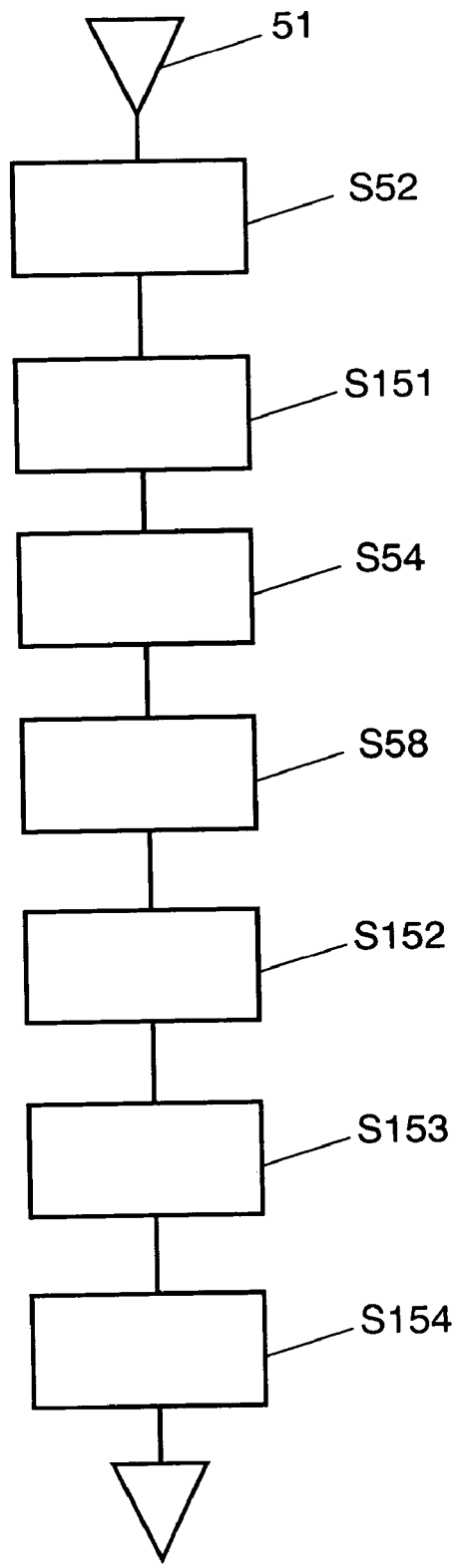
FIG. 16 is a manufacture flowchart of the shield case in embodiment 3.

Next, a method for manufacturing shield case 131 in embodiment 3 will be described with reference to the drawings. FIG. 16 is a manufacturing flowchart of shield case 131 in embodiment 3. In FIG. 16, the same components as those of FIG. 5 are denoted with the same reference numerals and will not be described further.

In FIG. 16, hoop material 51 wound to have a roll-like shape is the material for shield case 131.

In reference hole processing step S52, reference holes are processed in hoop material 51.

Reference hole processing step S52 is followed by punching step S151. In punching step S151, notch 143, division section 144, hole 142, and a transformer for maintaining the linkage with hoop material 51 in the subsequent draw processing are subjected to a punching process.

Next, V-shaped drawing step S54 forms V-shaped barrier 136 on hoop material 51. At this point, linkage section 139 is bent to have angle 57 of only about 120 degrees.

V-shaped drawing step S54 is followed by step S58 for forming barrier 136. Barrier forming step S58 bends linkage section 139 to have an angle of substantially 180 degrees.

Barrier 136 is provided by V-shaped drawing step S54 and forming step S58. Thus, shield case 131 can be realized in which the height of barrier 136 is set with high accuracy. Therefore, when shield case 131 is attached to printed circuit board 111, a space between the tip end of linkage section 139 and ground pattern 112 can be reduced, thus improving the shielding performance. Linkage section 139 can be securely soldered with ground pattern 112, thus providing a shielding more securely.

Forming step S58 is followed by draw processing step S152. Draw processing step S152 forms side plates 133 simultaneously. Since draw processing step S152 forms side plates 133 and drawing sections 133*a* simultaneously, side plate 133 and drawing section 133*a* be formed such that the can be formed such that the is highly accurate. This suppresses looseness in shield case 131 when shield case 131 is attached to printed circuit board 111, for example.

Next, flat section formation step S153 is a step that subjects the tip end of linkage section 139 to "flash mold" to provide flat section 140. In embodiment 3, linkage section 139 includes holes 142 provided with a substantially fixed interval. Thus, the face molding is prevented from causing deformation of a part in the vicinity of the tip end of linkage section 139, where the deformation includes deforming of wall 137 or 138 or changing of the angle of linkage section 139.

However, flat section formation step S153 is not performed and flat section 140 is not formed in a case where walls 137 and 138 may be deformed by flat section formation step S153 (e.g., a case in which hole 142 is not provided).

Flat section processing step S153 is followed by outer shape processing step S154 in which the outer periphery of connection section 134 is cut.

Shield case 131 is completed by the steps as described above. Although embodiment 3 uses a processing method involving a progressive press processing, a method by transfer may be used.

By the structure as described above, wall 137 and wall 138 in barrier 136 are linked by bending linkage section 139 with an angle of substantially 180 degrees. Furthermore, side plates 133 adjacent to barrier 136 include notches 143 and division section 144. Thus, barrier 136 can be provided even when no hole is provided in ceiling section 132. This can suppress a signal from a circuit provided on printed circuit board 111 from being leaked to outside. Thus, shield case 131 having a favorable shielding performance can be provided.

Furthermore, barrier 136 at linkage section 139 is provided by being bent with an angle of 180 degrees. Thus, oscillator 115 and PLL circuit 116 have therebetween a double structure formed by walls 137 and 138. As a result, these circuit blocks can be securely shielded from each other. This suppresses an interception caused by interference by signals therefrom, for example.

Furthermore, shield case 131 in embodiment 3 is provided by the draw processing. Thus, shield case 131 surrounding the entire peripheries of the respective circuit blocks of transmitter circuit 115 and PLL circuit 116 can substantially perfectly seal high-frequency signals. This can result in shield case 131 having a favorable shielding performance.

In addition to this, linkage section 139 includes flat section 140. This can increase an area in which ground pattern 112 is opposed to the flat section. As a result, linkage section 139 can be soldered with ground pattern 112 in a secure manner to increase the connection strength. Thus, such a high-frequency module can be realized with increased reliability so that solder cracking of a connection section is suppressed.

In embodiment 3, the tip end of flat section 140 and connection section 134 have substantially the same height. However, the tip end of flat section 140 may have a height higher than that of connection section 134 so that a step is provided between connection section 134 and flat section 140. In this case, when shield case 131 is attached to printed circuit board 111, a space is provided between the tip end of flat section 140 and ground pattern 112. This can suppress looseness in shield case 131 when shield case 131 is attached to printed circuit board 111, for example. In this case, the step is preferably about 0.02 mm in order to reduce the space between the tip end of flat section 140 and ground pattern 112 as much as possible.

Figure 17:
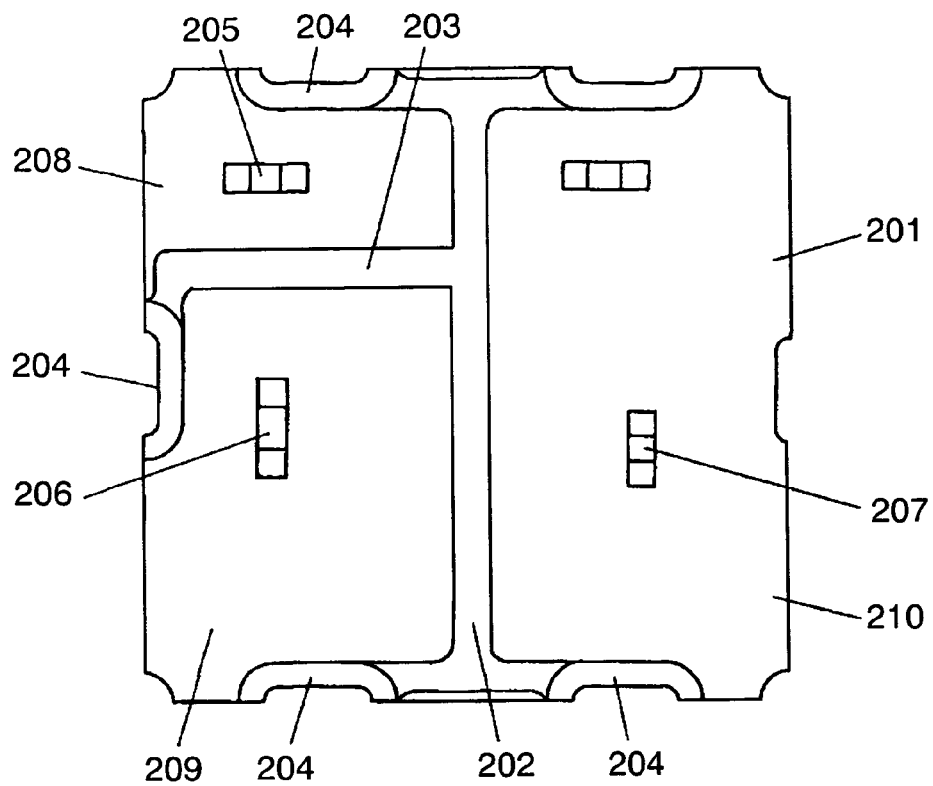
FIG. 17 is a plan view showing a printed circuit board in embodiment 4 of the present invention.
Figure 18:
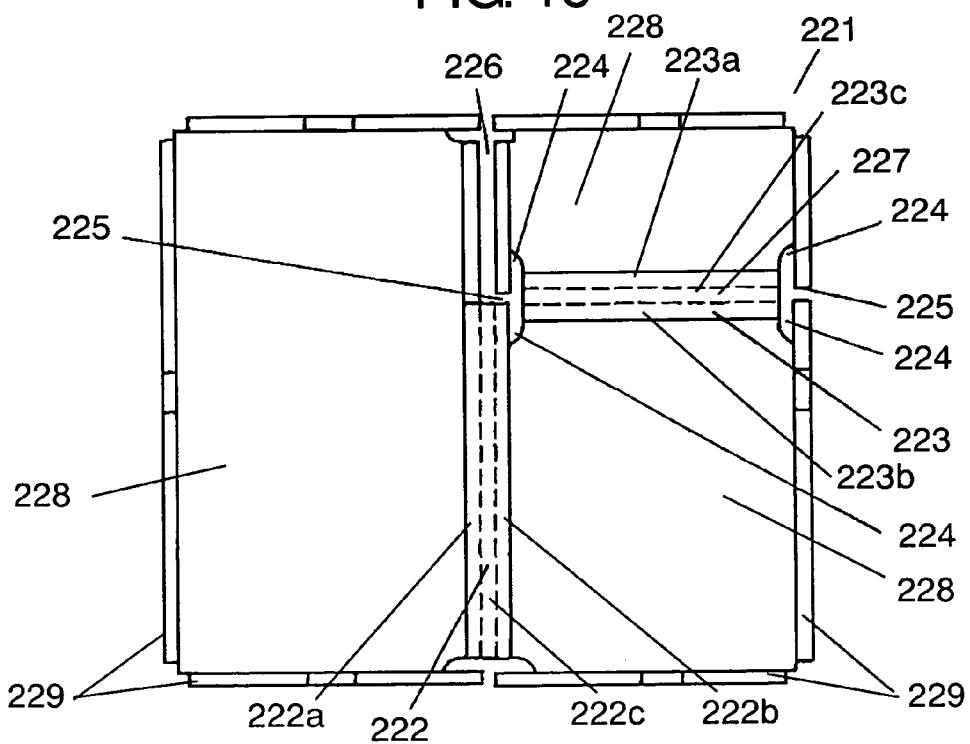
FIG. 18 is a bottom view showing a shield case in embodiment 4 of the present invention.

Hereinafter, embodiment 4 will be described with reference to the drawings. FIG. 17 is a plan view illustrating a printed circuit board in embodiment 4. FIG. 18 is a bottom view illustrating a shield case in embodiment 4. In FIG. 17 and FIG. 18, the same components as those of FIGS. 1 to 16 are denoted with the same reference numerals and will not be described further.

First, with reference to FIG. 17, the printed circuit board used in embodiment 4 will be described. As shown in FIG. 17, printed circuit board 201 has: ground pattern 202 provided at substantially the center; and ground pattern 203 provided so as to be orthogonal to ground pattern 202.

Ground patterns 202 and 203 form a T-like shape and are connected to ground terminals 204 provided at the end sections of printed circuit board 201, respectively.

Both sides sandwiching ground patterns 202 and 203 are attached electronic components 205, 206, and 207, respectively. As a result, oscillator circuit 208 is provided above ground pattern 203, PLL circuit 209 is provided below ground pattern 203, and receiving circuit 210 is provided at the right side of ground pattern 202, as shown in FIG. 17. Specifically, ground patterns 202 and 203 can separate oscillator circuit 208 from PLL circuit 209, oscillator circuit 208 from receiving circuit 210, or PLL circuit 209 from receiving circuit 210. Here, oscillator circuit 208 is an example of the first circuit block and PLL circuit 209 is an example of the second circuit block.

Shield case 221 in embodiment 4 will be described with reference to FIG. 18. Embodiment 4 in FIG. 18 is different from embodiment 1 in that two barriers 222 and barrier 223 are provided. Shield case 221 has notches 224 at crossing sections at which ceiling section 228 crosses side plate 229. Shield case 221 also has notches 224 and divisions section 225 provide at a crossing section at which barrier 222 crosses barrier 223. Shield case 221 further has separation section 226 at barrier 222, where linkage section 222*c* is cut off.

As described in embodiment 1, barrier 222 has wall 222*a* and wall 222*b*, and linkage section 222*c* for linking wall 222*a* to wall 222*b*. Barrier 223 has wall 223*a* and wall 223*b*, and linkage section 223*c* for linking wall 223*a* to wall 223*b*. Here, wall 222*a* and wall 222*b* correspond to the first and second walls, respectively, and wall 223*a* and wall 223*b* correspond to the third and fourth walls, respectively. Opening section 227 is provided above linkage section 223*c*.

By the structure as described above, shield case 221 can be provided with two barriers 222 and 223 orthogonal to each other. The attachment of shield case 221 to printed circuit board 201 can provide a shielding among oscillator circuit 208, PLL circuit 209 and receiving circuit 210 more securely.

The shield case according to the present invention has an effect of providing an improved shielding performance between circuits and can be used in a high-frequency apparatus requiring a superior shielding performance for example.

What is claimed is:

1. A high-frequency module comprising:
a printed circuit board;
a plurality of electronic components mounted on at least one of an upper face and a lower face of the printed circuit board;
a first circuit block including the electronic components;
a second circuit block adjacent to the first circuit block; and
a shield case for covering the first circuit block and the second circuit block,
wherein:
the shield case includes:
a ceiling section for covering the first and second circuit blocks;
a side plate orthogonally bent from an outer periphery of the ceiling section;
a connection section that is provided at a tip end of the side plate and that is connected to the printed circuit board; and
a first barrier that is provided at an intermediate part of the ceiling section to be orthogonal to the ceiling section and segmentalizes the ceiling section,
the first barrier has:
a first wall provided by being bent from one of segmentalized parts of the ceiling section;
a second wall that is opposed to the first wall and that is provided by being bent from the other of the segmentalized parts of the ceiling section; and
a linkage section for linking a tip end of the second wall to a tip end of the first wall,
the shield case is provided with notches at a part at which the first wall, the ceiling section and the side plate cross one another and a part at which the second wall, the ceiling section and the side plate cross one another,
the side plate includes a division section, to divide the side plate into neighboring side plate sections, extending from the notches in a downward direction;
a boundary between the first circuit block and the second circuit block is provided at a position corresponding to the first barrier; and
the connection section is connected to a ground of the first circuit block or the second circuit block.

2. The high-frequency module according to claim 1, wherein the connection section is parallel with the upper face of the printed circuit board.

3. The high-frequency module according to claim 1, wherein an entire face of the tip end of the side plate is used as the connection section.

4. The high-frequency module according to claim 1, wherein the neighboring side plate sections are linked by a drawing section.

5. The high-frequency module according to claim 1, wherein a tip end of the linkage section has a flat section that is substantially parallel to the upper face of the printed circuit board.

6. The high-frequency module according to claim 1, wherein the shield case further has a leg, the leg protrudes from an end section of any one of the first wall and the second wall or protrudes from the linkage section in the downward direction.

7. The high-frequency module according to claim 1, wherein the high-frequency module has a hole in the vicinity of a tip end of the linkage section.

8. The high-frequency module according to claim 1, wherein the high-frequency module has an uneven step in the vicinity of a tip end of the linkage section.

9. The high-frequency module according to claim 1, wherein a space at which the first wall is opposed to the second wall is opened as a first opening section at an upper part and the first opening section has a width equal to or smaller than a thickness of the shield case.

10. The high-frequency module according to claim 1, wherein:
the first barrier is provided so as to be orthogonal to the ceiling section and the high-frequency module further has a second barrier crossing the first barrier,
the second barrier has:
a third wall provided by being bent from the ceiling section;
a fourth wall that is opposed to the third wall and that is provided by being bent from the ceiling section;
a second linkage section for linking a tip end of the fourth wall to a tip end of the third wall; and
a second opening section provided above the second linkage section,
the second linkage section is provided to be bent,
the shield case has:
second notches respectively provided at a part at which the third wall, the ceiling section, and the side plate cross one another; a part at which the fourth wall, the ceiling section, and the side plate cross one another; a part at which the third wall, the ceiling section, and the first or second wall cross one another; and a part at which the fourth wall, the ceiling section, and the first or second wall cross one another, and
a second division section, for dividing the side plate or the first or second wall, extending from each of the second notches in the downward direction.

11. The high-frequency module according to claim 1, wherein an upper face of the printed circuit is provided with a ground pattern at the boundary between the first circuit block and the second circuit block, the ground pattern is provided at a position corresponding to the linkage section, and the ground pattern is soldered with the linkage section.

12. The high-frequency module according to claim 1, wherein the boundary between the first circuit block and the second circuit block is provided at a position corresponding to the first barrier, an upper face of the printed circuit board is provided with a conductor that is formed between the first and second circuit blocks to spread across the boundary, and the linkage section has a conduction avoiding section provided at a position corresponding to the conductor.

13. The high-frequency module according to claim 1, wherein the connection section is provided on an entire face of a tip end of the side plate, the printed circuit board has the ground of the first or second circuit block at a position corresponding to the connection section, and the ground is soldered with the connection section.

14. The high-frequency module according to claim 1, wherein the high-frequency module further has a leg that protrudes from an end section of one of the first wall and the second wall or protrudes from the linkage section in the downward direction, the printed circuit board has a through hole connected to the ground of the first or second circuit block, the leg is inserted into the through hole, and the through hole is soldered with the leg.

15. The high-frequency module according to claim 1, wherein a space at which the first wall is opposed to the second wall is opened as a first opening section at an upper part and the first opening section is provided at a position other than a center of the ceiling section or a gravity center of the high-frequency module.

16. The high-frequency module according to claim 1, wherein a space at which the first wall is opposed to the second wall is opened as a first opening section at an upper part, the first opening section is provided at a center of the ceiling section or a gravity center of the high-frequency module, and the high-frequency module has a flat plate as a pickup section that is provided at the upper part of the first opening section to extend from the ceiling section.

17. An electronic device including a high-frequency module,
the high-frequency module comprising:
a printed circuit board;
a plurality of electronic components mounted on at least one of an upper face and a lower face of the printed circuit board;
a first circuit block including the electronic components;
a second circuit block adjacent to the first circuit block; and
a shield case for covering the first circuit block and the second circuit block,
wherein:
the shield case includes:
a ceiling section for covering the first and second circuit blocks;
a side plate orthogonally bent from an outer periphery of the ceiling section;
a connection section that is provided at a tip end of the side plate and that is connected to the printed circuit board; and
a first barrier that is provided at an intermediate part of the ceiling section to be orthogonal to the ceiling section to segmentalize the ceiling section,
the first barrier has:
a first wall provided by being bent from one of segmentalized parts of the ceiling section;
a second wall that is opposed to the first wall and that is provided by being bent from the other of the segmentalized parts of the ceiling section; and
a linkage section for linking a tip end of the second wall to a tip end of the first wall,
the shield case is provided with notches at a part at which the first wall, the ceiling section, and the side plate cross one another and a part at which the second wall, the ceiling section, and the side plate cross one another,
the side plate includes a division section, to divide the side plate into neighboring side plate sections, extending from the notches in a downward direction;
a boundary between the first circuit block and the second circuit block is provided at a position corresponding to the first barrier; and
the connection section is connected to a ground of the first circuit block or the second circuit block.

18. The electronic device according to claim 17, wherein the high-frequency module has a space opened as a first opening section at an upper part at which the first wall is opposed to the second wall,
the first opening section is provided at a position other than a center of the ceiling section or a gravity center of the high-frequency module.

19. The electronic device according to claim 17, wherein the high-frequency module has a space opened as a first opening section at an upper part at which the first wall is opposed to the second wall,
the first opening section is provided at a center of the ceiling section or a gravity center of the high-frequency module, and
the high-frequency module has a flat plate as a pickup section that is provided at the upper part of the first opening section to extend from the ceiling section.

* * * * *